US012568609B2

(12) United States Patent
Joshi et al.

(10) Patent No.: US 12,568,609 B2
(45) Date of Patent: Mar. 3, 2026

(54) THERMAL MANAGEMENT SYSTEMS FOR RECTIFIER ASSEMBLIES

(71) Applicant: Hamilton Sundstrand Corporation, Charlotte, NC (US)

(72) Inventors: Ashutosh Joshi, Roscoe, IL (US); Eric A. Carter, Monroe, WI (US); Coralyn J. Saxby, Davis, IL (US); Debabrata Pal, Hoffman Estates, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 260 days.

(21) Appl. No.: 18/220,676

(22) Filed: Jul. 11, 2023

(65) Prior Publication Data

US 2025/0024650 A1     Jan. 16, 2025

(51) Int. Cl.
H05K 7/20      (2006.01)
H02G 5/10      (2006.01)
H02M 7/00      (2006.01)

(52) U.S. Cl.
CPC .............. H05K 7/209 (2013.01); H02G 5/10 (2013.01); H02M 7/003 (2013.01); H05K 7/20272 (2013.01); H05K 7/20927 (2013.01)

(58) Field of Classification Search
None
See application file for complete search history.

(56) References Cited

U.S. PATENT DOCUMENTS 3,275,856 A     9/1966   Chumakov
5,132,777 A     7/1992   Kloucek 10,856,450 B2 *  12/2020  Tokuyama ............ H02M 7/537
2006/0138452 A1*  6/2006  Knapp .................. H01L 25/072
                                                  257/E23.101
2008/0054439 A1*  3/2008  Malhan ............... H01L 23/5385
                                                  257/E23.071
2009/0091892 A1*  4/2009  Otsuka ............... H05K 7/20918
                                                  361/715

(Continued)

FOREIGN PATENT DOCUMENTS

DE          2938096 A1    4/1981
WO        2020182366 A1    9/2020
WO     WO-2023046365 A1    3/2023

OTHER PUBLICATIONS

European Search Report dated Dec. 17, 2024 in connection with European Patent Application No. 24184991.8, 12 pages.

*Primary Examiner* — Courtney L Smith

(57)     ABSTRACT

In accordance with at least one aspect of this disclosure, a rectifier assembly includes, at least, a first diode disposed between a first bus bar and a second bus bar. The rectifier assembly further includes, a first thermal management structure and a second thermal management structure. The first thermal management structure is configured to electrically connect the first bus bar to the first diode and be in thermal communication between the first bus bar and a first side of the first diode to transfer heat between the first bus bar and the first diode. The first thermal management structure is configured to transfer heat between the first bus bar and the first thermal management structure. The first thermal management structure is also configured to allow a fluid to flow therethrough to transfer heat from the first thermal management structure to the fluid flowing therethrough.

20 Claims, 3 Drawing Sheets

(56)         References Cited

U.S. PATENT DOCUMENTS

| | | | |
|---|---|---|---|
| 2010/0302733 A1 | 12/2010 | Woody et al. | |
| 2019/0208671 A1* | 7/2019 | Kitanaka | H05K 7/20209 |
| 2022/0181949 A1* | 6/2022 | Patel | H02M 7/06 |
| 2024/0215210 A1* | 6/2024 | Joshi | H05K 7/20927 |
| 2024/0341059 A1* | 10/2024 | Joshi | H02K 11/05 |

* cited by examiner

200

214

216

206

200

206

212

214

THERMAL MANAGEMENT SYSTEMS FOR RECTIFIER ASSEMBLIES

TECHNICAL FIELD

The present disclosure relates to cooling systems, and more particularly to cooling systems for rectifier diode assemblies.

BACKGROUND

In certain applications, certain power electronics need to be mounted close to the generator. Typically, high temperature oil is used to cool the generator and the same oil is used for cooling an attached rectifier. However, the power electronics may be rated to a lower junction temperature than generator winding temperature limits. Thus, heat flux in power electronics (e.g., diode) devices can be very high. Efficient cooling means are needed to maintain sufficient temperatures for the power electronics, but must also meet certain size and weight requirements for the given application (e.g., in aircraft).

The conventional techniques have been considered satisfactory for their intended purpose. However, there is an ever present need for improved systems and methods for cooling said power electronics. This disclosure provides a solution for this need.

SUMMARY

In accordance with at least one aspect of this disclosure, a rectifier assembly includes, at least, a first diode disposed between a first bus bar and a second bus bar. The rectifier assembly further includes, a first thermal management structure and a second thermal management structure. The first thermal management structure is configured to electrically connect the first bus bar to the first diode and be in thermal communication between the first bus bar and a first side of the first diode to transfer heat between the first bus bar and the first diode. The first thermal management structure is configured to transfer heat between the first bus bar and the first thermal management structure. The first thermal management structure is also configured to allow a fluid to flow therethrough to transfer heat from the first thermal management structure to the fluid flowing therethrough.

The second thermal management structure is configured to interface with a second side of the first diode and configured to transfer heat between the first diode and the second thermal management structure. The second thermal management structure is configured to allow a fluid to flow therethrough to transfer heat from the second thermal management structure to the fluid flowing therethrough. A fluid port is defined in through the rectifier assembly configured to allow the fluid to flow to the first thermal management structure and the second thermal management structure.

In embodiments, the first thermal management structure can include, a first plurality of louvers extending from the first bus bar to the first side of the first diode. The first plurality of louvers can define a plurality of fluid channels therebetween to provide the fluid to the first side of the first diode. In embodiments, the first plurality of louvers can be of a metallic material configured to electrically connect the first diode to the first bus bar. In embodiments, the first plurality of louvers can be mechanically fixed to the first bus bar and configured to contact the first side (e.g., a terminal portion) of the first diode. The first plurality of louvers can be only in touch contact with the first diode and are not fixed to the first side of the first diode, such that the first diode can be inserted (e.g., by sliding) into rectifier assembly between at least the plurality of louvers.

In embodiments, the second thermal management structure can include a first plurality of channels defined in a first side of the second bus bar configured to supply the fluid to at least a portion of the second side of the first diode.

In certain embodiments, the rectifier assembly can further include a second diode disposed between the second bus bar and the first bus bar. The second diode can be configured to interface with the second thermal management structure to transfer heat between the second diode and the second thermal management structure. The second thermal management structure can be configured to allow the fluid to flow therethrough to transfer heat from the second thermal management structure to the fluid flowing therethrough.

The rectifier assembly can also include a third thermal management structure configured to electrically connect the first bus bar to the second diode. The third thermal management structure can be configured to be in thermal communication between the first bus bar and a first side of the second diode to transfer heat between the first bus bar and the second diode. The third thermal management structure can be configured to transfer heat between the first bus bar and the third thermal management structure. The third thermal management structure can be configured to allow a fluid to flow therethrough to transfer heat from the third thermal management structure to the fluid flowing therethrough.

In embodiments, the third thermal management structure can further include a second plurality of louvers extending between the first bus bar and the first side of the second diode. The second plurality of louvers can define a plurality of cooling fluid channels therebetween to provide the cooling fluid to the first side of the second diode. In certain embodiments, the second plurality of louvers can be of a metallic material configured to electrically connect the second diode to the first bus bar. The second plurality of louvers can be mechanically fixed to the first bus bar and configured to contact a the first side of the second diode. The second plurality of louvers may not be fixed to the first side of the second diode (e.g., to allow insertion of the diode between the first and third thermal management structures.

In embodiments, the second thermal management structure can include a second plurality of channels defined in a second side of the second bus bar configured to supply the fluid to at least a portion of the second side of the second diode. The first and second plurality of channels defined in the second bus bar can be interdigitated.

In embodiments, the first diode, the second diode, and the second bus bar are held in compression between the first thermal management structure and the third thermal management structure. The second bus bar can be sandwiched between the first diode and the second diode, and the first and second diodes can be sandwiched between the first and third thermal management structures.

In certain embodiments, the first bus bar can form a housing around at least the first diode, the first thermal management structure, and the second thermal management structure. In certain embodiments, the first bus bar can be a cylindrical bus bar. In certain embodiments, one or more additional bus bars can be electrically connected to the first bus bar to form the housing. In certain embodiments, the housing assembly can include an aperture defined in the first bus bar configured to receive the second bus bar, the first diode, and the second diode therethrough. In embodiments, the second bus bar can be configured to extend through the aperture and beyond the housing with second bus bar installed in the housing.

In accordance with at least one aspect of this disclosure, a system can include, a generator system having a sump portion and a rectifier assembly electrically connected to a generator assembly. The rectifier assembly can be disposed in a sump portion of the generator assembly. In embodiments, the rectifier assembly can any embodiment of the rectifier assembly described herein. In embodiments. the fluid port of the rectifier assembly can be configured to be submerged in the sump portion of the generator assembly to provide the fluid from the sump portion to the first and second thermal management devices through the cooling fluid port. In certain embodiments, the fluid can be oil. In certain embodiments, the generator system can be configured to be installed in a vehicle, and the first and second thermal management structures are configured to convey the fluid therethrough during a maneuver of the vehicle (e.g., a change in orientation relative to the direction of gravity).

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, other embodiments thereof will be described in detail herein below with reference to certain figures, wherein.

DETAILED DESCRIPTION

Figure 1:
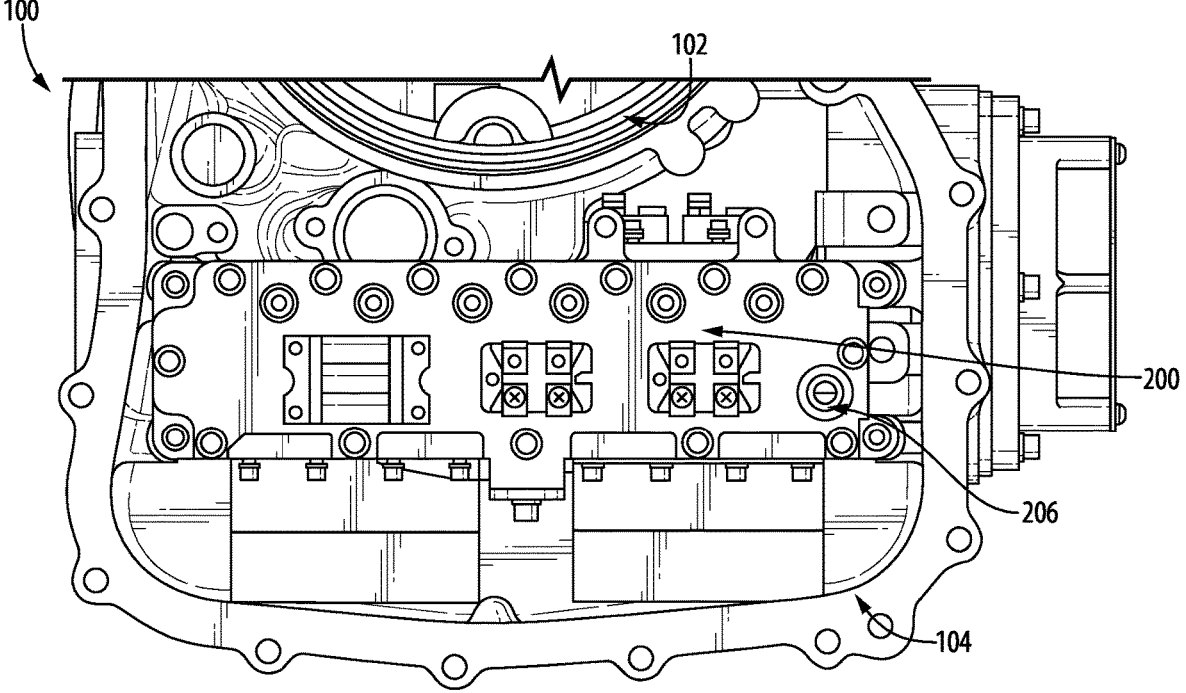
FIG. 1 is a system in accordance with this disclosure, showing an embodiment of a rectifier assembly installed in an embodiment of a generator assembly.
Figure 2:
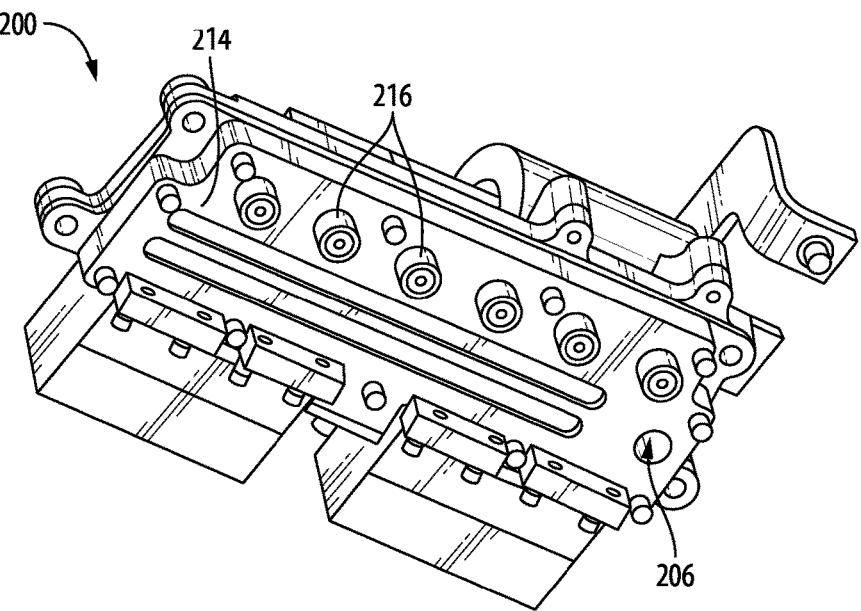
FIG. 2 is a perspective view of an embodiment of a rectifier assembly.
Figure 3:
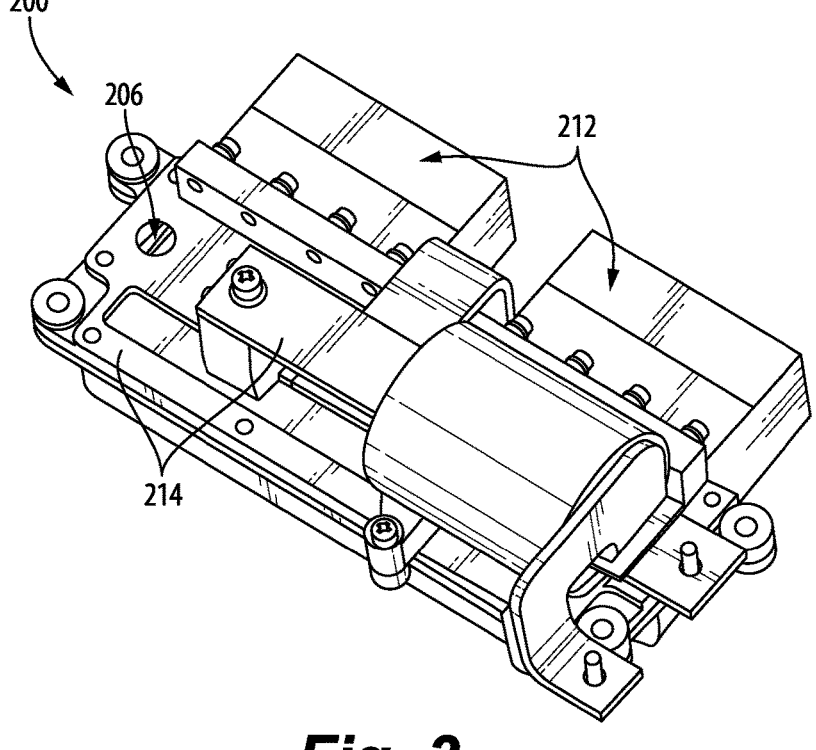
FIG. 3 is another perspective view of the rectifier assembly of FIG. 2.
Figure 4:
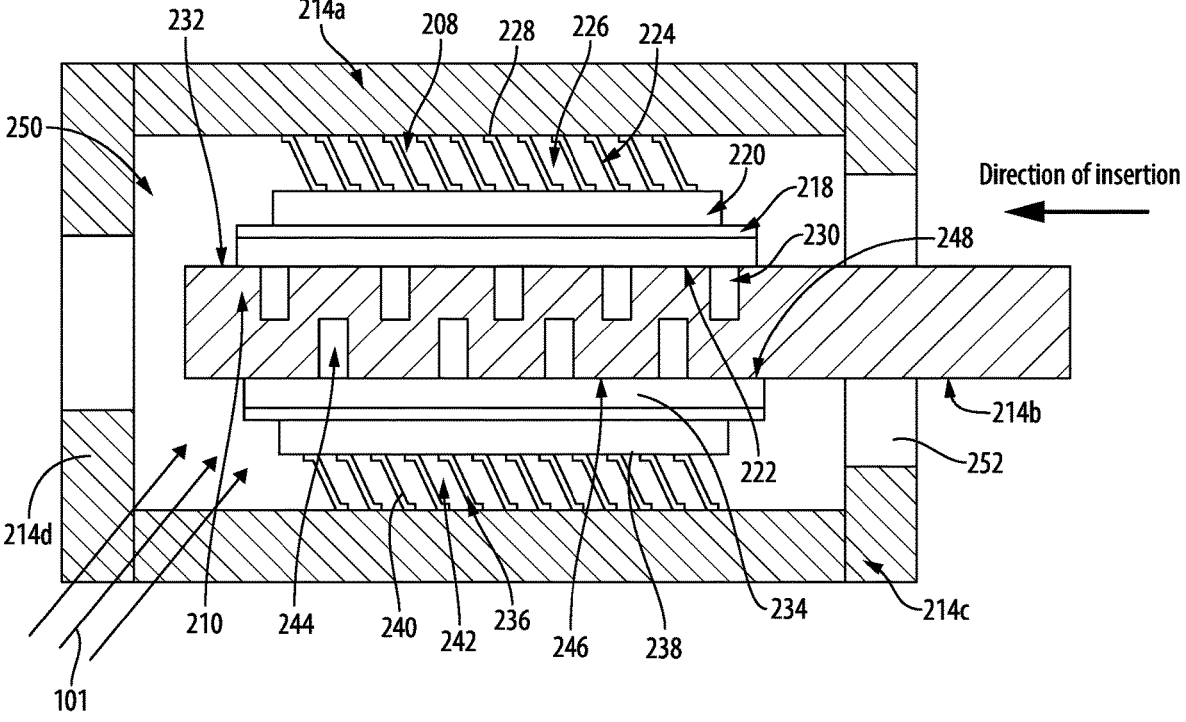
FIG. 4 is a cross-sectional view of an embodiment of a diode pack configured to be installed in an embodiment of a rectifier assembly in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1 and is designated generally by reference character 100. Other embodiments and/or aspects of this disclosure are shown in FIGS. 2-4. Certain embodiments described herein can be used to provide thermal management for rectifier assemblies and diode packs of a rectifier assembly.

In accordance with at least one aspect of this disclosure, a system 100 can include a generator system 102 having a sump portion 104 and a rectifier assembly 200 electrically connected to a generator assembly 102. As shown in FIG. 1, the rectifier assembly 200 can be disposed in the sump portion 104 of the generator assembly 102. In embodiments, a fluid port 206 of the rectifier assembly 200 can be configured to be submerged in a fluid in the sump portion 104 of the generator assembly 102 to provide the fluid from the sump portion 104 to a first and second thermal management devices 208, 210 through the fluid port 206, as discussed further below. In certain embodiments, the fluid can be oil. In certain embodiments, the generator assembly 102 can be configured to be installed in a vehicle, and the first and second thermal management structures 208, 210 are configured to hold the fluid therein to provide thermal management during a maneuver of the vehicle (e.g., a change in orientation relative to the direction of gravity, such as roll or pitch), even if the fluid is not actively flowing through the devices 208, 210 or is drawn away from the devices 208, 210.

As shown in FIGS. 1-3, the rectifier assembly 200 can further include, at least, one or more electrical components, including, the first and second thermal management structures 208, 210, one or more capacitors 212, bus bars 214, and diode packs 216, among others. Referring now to FIG. 4, which shows one diode pack 216) a first diode 218 can be disposed between a first bus bar 214a and a second bus bar 214b. The rectifier assembly 200 can further include the first thermal management structure 208 and the second thermal management structure 210. The first thermal management structure 210 can be configured to electrically connect the first bus bar 214a to the first diode 218 and be in thermal communication between the first bus bar 214a and a first side 220 (e.g., a terminal portion) of the first diode 218 to transfer heat between the first bus bar 214a and the first diode 218. The first thermal management structure 208 can be configured to transfer heat between the first bus bar 214a and the first thermal management structure 208. The first thermal management structure 208 can also be configured to allow the fluid 101 to flow therethrough to transfer heat from the first thermal management structure 208 to the fluid 101 flowing therethrough.

The second thermal management structure 210 can be configured to interface with a second side 222 of the first diode 218 and configured to transfer heat between the first diode 218 and the second thermal management structure 210. The second thermal management structure 210 can be configured to allow the fluid 101 to flow therethrough to transfer heat from the second thermal management structure 210 to the fluid flowing therethrough. The fluid port 206 (not shown in FIG. 4) is defined in through the rectifier assembly 200 configured to allow ingress and egress of the fluid 101 into the first thermal management structure 208 and the second thermal management structure 210 as the fluid 101 moves in the sump portion 104.

In embodiments, the first thermal management structure 208 can include a first plurality of louvers 224 extending from the first bus bar 214a to the first side 220 of the first diode 218. The first plurality of louvers 224 can define a plurality of fluid channels 226 therebetween to provide the fluid 101 to the first side 220 of the first diode 218 and to the louvers 224. In embodiments, the first plurality of louvers 224 can be of a metallic material configured to electrically connect the first diode 218 to the first bus bar 214a. In embodiments, the first plurality of louvers 224 can be mechanically fixed to the first bus bar at an interface 228 (e.g., welded, soldered, adhered) and can be configured to contact the first side 220 (e.g., the terminal portion) of the first diode 218.

The first plurality of louvers 224 can be only in touch contact with the first diode 218 and may not be fixed to the first side 220 of the first diode 218. This allows for the first diode 218 to be inserted (e.g., by sliding) into the rectifier assembly 200. In FIG. 4, the first diode 281 can be inserted while attached to the second bus bar 214b by sliding the bus bar 214b into the assembly from the right hand side. The louvers 224 can have a diagonal "z" shape relative to the direction of flow of the fluid 101 therethough. The "z" shape of the louvers 224 provides some amount of spring, or resiliency to allow for the sliding insertion of the diode and bus bar, but to allow for compression of the first diode to the second bus bar 214b. In certain embodiments, the first diode 218 can be attached to the second bus bar 214b before insertion into the louvers 224.

In embodiments, the second thermal management structure 210 can include a first plurality of channels 230 defined in a first side 232 of the second bus bar 214b configured to supply the fluid 101 to at least a portion of the second side 222 of the first diode 218, such that the second bus bar 214b defines at least a portion of the second thermal management structure 210.

In certain embodiments, a second diode 234 disposed between the second bus bar 214b and the first bus bar 214a, but across the second bus bar 214b. The second diode 234 can be configured to interface with the second thermal management structure 210 to transfer heat between the second diode 234 and the second thermal management structure 210. The second thermal management structure 210 can be configured to allow the fluid 101 to flow therethrough to transfer heat from the second thermal management structure 210 to the fluid 101 flowing therethrough.

A third thermal management structure 236 can be configured to electrically connect the first bus bar 214a to the second diode 234. The third thermal management structure can be configured to be in thermal communication between the first bus bar 214a and a first side (e.g., terminal side) 238 of the second diode 234 to transfer heat between the first bus bar 214a and the second diode 234. The third thermal management structure 236 can be configured to transfer heat between the first bus bar 214a and the third thermal management structure 236. The third thermal management structure 236 can be configured to allow the fluid 101 to flow therethrough to transfer heat from the third thermal management structure 236 to the fluid 101 flowing therethrough.

In embodiments, the third thermal management structure 236 can be the same or similar to that of the first thermal management structure 208, e.g., including a second plurality of "z" shaped louvers 240 forming a plurality of channels 242 therebetween. The louvers 240 can extend between the first bus bar 214a and the first side 238 of the second diode 234. In embodiments, e.g., as shown, the first diode 218, the second diode 234, and the second bus bar 214b can be held in compression between the first thermal management structure 208 and the third thermal management structure 236, e.g., due to the spring like nature of the "z" shaped louvers 224, 240. The second bus bar 214b can be sandwiched between the first diode 218 and the second diode 234, and the first and second diodes 218, 234 can be sandwiched between the first and third thermal management structures 208, 236.

In embodiments, the second thermal management structure 210 can further include a second plurality of channels 244 defined in a second side 246 of the second bus bar 214a configured to supply the fluid 101 to at least a portion of the second side 248 of the second diode 234 with the second side 248 of the second diode 224 interfaced with the second side 246 of the second bus bar 214b. The plurality of channels 230 and 244 defined in the second bus bar 214b can be interdigitated with each other. In embodiments, the total number of channels 230, 244 and/or louvers 224, 240 can be determined as balance between electrical connection quality (e.g., thick enough for current and sufficient electrical contact) vs. thermal management (e.g., heating and/or cooling).

For example, as shown, a total number of channels on each side of the second bus bar 214b can be between 3 and 6, e.g., 5 on the first side 222 of the second bus bar 214b and four on the second side 248 of the second bus bar 214b. As shown, the channels can be interdigitated on opposite sides of the second bus bar 214b.

In certain embodiments, the first bus bar 214a can form a housing 250 around at least the first diode 218, the first thermal management structure 208, and the second thermal management structure 210. As shown, the housing 250 can enclose all of the first bus bar 214a can form a housing around at least the first diode 218, the first thermal management structure 208, the second thermal management structure 210, the second diode 234 and the third thermal management structure 236. In certain embodiments, the first bus bar 214a can be a cylindrical bus bar. In certain embodiments, one or more additional bus bars 214c, 214d can be electrically connected to the first bus bar 214a to form a remainder of the housing 250. In certain embodiments, the housing 250 can include an aperture 252 defined in one of the bus bars forming the housing (e.g., in certain embodiments the first bus bar) configured to receive the second bus bar 214b, the first diode 218, and the second diode 234 therethrough. In embodiments, the second bus bar 214b can be configured to extend through the aperture 252 and beyond the housing 250 with second bus bar 214b installed in the housing 250.

Embodiments of the proposed system can include a rectifier assembly having a diode pack, wherein the diodes of the diode pack are compressed between bus bars using multi-contact louvers on one side of diode and bus bar, where the bus bar includes channels on the side of the bus bar opposite from where the diode is attached. A heat transfer fluid (e.g., a cooling oil in embodiments) can be flowing around the diode, between the multi-contacts louvers and through the bus bar channels. Additional bus bars can be disposed around the diode (e.g, AC and DC bus bars) to form a diode pack housing, e.g., as shown in FIG. 4. In certain embodiments, the input side bus bars can be AC and the rectified output side bus bars can be DC bus bars, however any suitable configuration of AC/DC bus bars is contemplated herein.

In embodiments the louvers can be under compression to make contact with bus bars and diode tabs to transfer both heat and current between the diodes and the louvers and the bus bar and the louvers through the diode. In embodiments a total number of contacts cam be optimized to achieve optimal thermal, mechanical, and electrical performance. Moreover, embodiments also provide for selection of a number of contacts configured to reduce Joule heating (e.g., the self-heating of louver contacts). In certain embodiments, the diode can be thermally connected to efficient cooling by utilizing a hybrid thermal management approach, including using louvers on one side of the diode and larger thermal mass (e.g., the second bus bar) on other side of the diode to provide thermal management during periods where no cooling fluid flow is present (e.g., when cooling fluid is pulled away from the diode pack).

In certain embodiments, the multi-contact louvers can be made from copper to provide thermal and electrical connection between the diode tab and bus bar on one side of the diode (e.g., the terminal side), while the opposite side of the diode can be mounted directly to a bus bar, and the bus bar can further include cooling channels. As used herein, directly mounted means the diode is configured to interface with the bus bar without any intervening components therebetween. In embodiments, the louvers can include a spring nature to allow the louvers to remain in thermal and electrical contact with the diode and bus bar. Embodiments allow for improved thermal management due to direct cooling at the diode die level. In certain applications, the rectifier assembly may be required to withstand loss of cooling conditions, i.e. meet diode temperature requirement under no flow condition for shorts. Embodiments provide means for meeting these requirements.

In embodiments, multiple louvers can be included between the diode and the bus bar, which can reduce the current per contact, and thereby reduce heat generation due to Joule heating. Moreover, because of the diode contact with the bus bar, this provides the diode with connection to a larger thermal mass, this, the hybrid approach of the diode being thermally connected to both the louver and bus bar, embodiments can provide better thermal management (e.g., cooling) due to the increased surface area. In embodiments, the louvers can be configured to act as thermal transfer fins, drawing heat away from the diode and transferring the heat from the diode to fluid (e.g., the cooling oil).

In embodiments, the rectifier assembly can be cooled with oil that is used to cool the generator assembly as well as an integrated electronics generator system. Embodiments of the rectifier diode assembly 200 disclosed herein can be disposed in a wetted sump oil that is below the temperature limit of the electrical components.

Those having ordinary skill in the art understand that any numerical values disclosed herein can be exact values or can be values within a range. Further, any terms of approximation (e.g., "about", "approximately", "around") used in this disclosure can mean the stated value within a range. For example, in certain embodiments, the range can be within (plus or minus) 20%, or within 10%, or within 5%, or within 2%, or within any other suitable percentage or number as appreciated by those having ordinary skill in the art (e.g., for known tolerance limits or error ranges).

The articles "a", "an", and "the" as used herein and in the appended claims are used herein to refer to one or to more than one (i.e., to at least one) of the grammatical object of the article unless the context clearly indicates otherwise. By way of example, "an element" means one element or more than one element.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of."

Any suitable combination(s) of any disclosed embodiments and/or any suitable portion(s) thereof are contemplated herein as appreciated by those having ordinary skill in the art in view of this disclosure.

The embodiments of the present disclosure, as described above and shown in the drawings, provide for improvement in the art to which they pertain. While the apparatus and methods of the subject disclosure have been shown and described, those skilled in the art will readily appreciate that changes and/or modifications may be made thereto without departing from the scope of the subject disclosure.

What is claimed is:

1. A rectifier assembly, comprising:
a first diode disposed between a first bus bar and a second bus bar;
a first thermal management structure configured to electrically connect the first bus bar to the first diode, wherein the first thermal management structure is configured to be in thermal communication with the first bus bar and a first side of the first diode and transfer heat between the first bus bar and the first diode, wherein the first thermal management structure is configured to allow a fluid to flow therethrough to transfer heat from the first thermal management structure to the fluid flowing therethrough;
a second thermal management structure configured to interface with a second side of the first diode and transfer heat between the first diode and the second bus bar, wherein the second thermal management structure is configured to allow the fluid to flow therethrough to transfer heat from the second thermal management structure to the fluid flowing therethrough; and
a fluid port defined through the first bus bar and configured to allow the fluid to flow from outside the first bus bar to the first thermal management structure and the second thermal management structure.

2. The rectifier assembly of claim 1, wherein the first thermal management structure further comprises:
a first plurality of louvers extending from the first bus bar to the first side of the first diode, wherein the first plurality of louvers defines a plurality of fluid channels therebetween to provide the fluid to the first side of the first diode.

3. The rectifier assembly of claim 2, wherein the first plurality of louvers comprises a metallic material configured to electrically connect the first diode to the first bus bar.

4. The rectifier assembly of claim 3, wherein the first plurality of louvers is mechanically fixed to the first bus bar and configured to contact the first side of the first diode.

5. The rectifier assembly of claim 3, wherein the second thermal management structure includes a first plurality of channels defined in a first side of the second bus bar configured to supply the fluid to at least a portion of the second side of the first diode.

6. The rectifier assembly of claim 5, further comprising:
a second diode disposed between the second bus bar and the first bus bar, wherein the second diode is configured to interface with the second thermal management structure and transfer heat between the second diode and the second bus bar; and a third thermal management structure configured to electrically connect the first bus bar to the second diode, wherein the third thermal management structure is configured to be in thermal communication between the first bus bar and a first side of the second diode to transfer heat between the first bus bar and the second diode, wherein the third thermal management structure is configured to allow a fluid to flow therethrough to transfer heat from the third thermal management structure to the fluid flowing therethrough.

7. The rectifier assembly of claim 6, wherein the third thermal management structure further comprises:

a second plurality of louvers extending between the first bus bar and the first side of the second diode, wherein the second plurality of louvers defines a plurality of cooling fluid channels therebetween to provide the fluid to the first side of the second diode.

8. The rectifier assembly of claim 7, wherein the second plurality of louvers comprises a metallic material configured to electrically connect the second diode to the first bus bar.

9. The rectifier assembly of claim 8, wherein the second plurality of louvers is mechanically fixed to the first bus bar and configured to contact the first side of the second diode.

10. The rectifier assembly of claim 8, wherein the second thermal management structure includes a second plurality of channels defined in a second side of the second bus bar configured to supply the fluid to at least a portion of the second side of the second diode.

11. The rectifier assembly of claim 10, wherein the first diode, the second diode, and the second bus bar are held in compression between the first thermal management structure and the third thermal management structure, wherein the second bus bar is sandwiched between the first diode and the second diode.

12. The rectifier assembly of claim 1, wherein the first bus bar forms a housing around at least the first diode, the first thermal management structure, and the second thermal management structure.

13. The rectifier assembly of claim 12, wherein the first bus bar is a cylindrical bus bar.

14. The rectifier assembly of claim 12, further comprising one or more additional bus bars electrically connected to the first bus bar to form the housing.

15. The rectifier assembly of claim 12, wherein the housing includes an aperture defined in the first bus bar configured to receive the second bus bar and the first diode therethrough.

16. The rectifier assembly of claim 15, wherein the second bus bar is configured to extend through the aperture and beyond the housing with the second bus bar installed in the housing.

17. A system, comprising:

a generator assembly having a sump portion; and a rectifier assembly, wherein the rectifier assembly is electrically connected to the generator assembly, wherein the rectifier assembly is disposed in the sump portion of the generator assembly, wherein the rectifier assembly comprises:

a first diode disposed between a first bus bar and a second bus bar;

a first thermal management structure configured to electrically connect the first bus bar to the first diode, wherein the first thermal management structure is configured to be in thermal communication with the first bus bar and a first side of the first diode and transfer heat between the first bus bar and the first diode, wherein the first thermal management structure is configured to allow a fluid to flow therethrough to transfer heat from the first thermal management structure to the fluid flowing therethrough;

a second thermal management structure configured to interface with a second side of the first diode and transfer heat between the first diode and the second bus bar, wherein the second thermal management structure is configured to allow the fluid to flow therethrough to transfer heat from the second thermal management structure to the fluid flowing therethrough; and a fluid port defined through the first bus bar and configured to allow the fluid to flow from outside the first bus bar to the first thermal management structure and the second thermal management structure.

18. The system of claim 17, wherein the fluid port of the rectifier assembly is configured to be submerged in the sump portion of the generator assembly to provide the fluid from the sump portion to the first and second thermal management structures through the fluid port.

19. The system of claim 17, wherein the fluid is oil.

20. The system of claim 17, wherein the generator assembly is configured to be installed in a vehicle, wherein the first and second thermal management structures are configured to convey the fluid therethrough during a maneuver of the vehicle.

* * * * *